(12) United States Patent
Smith et al.

(10) Patent No.: US 7,064,596 B1
(45) Date of Patent: Jun. 20, 2006

(54) REDUCING CROWBAR CURRENT IN A LATCH HYSTERESIS RECEIVER

(75) Inventors: Christopher L. Smith, Essex Junction, VT (US); David E. Chapman, Shelburne, VT (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/327,571

(22) Filed: Dec. 20, 2002

(51) Int. Cl.
*H09K 3/12* (2006.01)

(52) U.S. Cl. .................. 327/206; 327/208; 327/218
(58) Field of Classification Search ........ 327/205–206, 327/199, 202, 203, 208, 210–215, 218, 219, 327/222
See application file for complete search history.

(56) References Cited

U.S. PATENT DOCUMENTS

| | | | | |
|---|---|---|---|---|
| 3,739,193 A | * | 6/1973 | Pryor | 326/113 |
| 4,369,381 A | * | 1/1983 | Okamoto et al. | 327/206 |
| 5,812,002 A | * | 9/1998 | Yoshida | 327/210 |
| 5,942,916 A | * | 8/1999 | Matsbara et al. | 326/83 |
| 6,097,229 A | * | 8/2000 | Hinterscher | 327/199 |
| 6,198,334 B1 | * | 3/2001 | Tomobe et al. | 327/391 |
| 6,285,227 B1 | * | 9/2001 | Takahashi et al. | 327/202 |

* cited by examiner

*Primary Examiner*—Long Nguyen (57) ABSTRACT

One embodiment of the present invention provides a latch hysteresis receiver circuit having reduced crowbar current. Within the present embodiment, the latch hysteresis receiver circuit comprises an input stage and a latch hysteresis switching element coupled to the input stage. Additionally, the latch hysteresis receiver circuit comprises a pass gate coupled to the latch hysteresis switching element and to an output of the latch hysteresis receiver circuit. It is noted that the pass gate may be for restricting current that flows through the latch hysteresis switching element.

13 Claims, 5 Drawing Sheets

REDUCING CROWBAR CURRENT IN A LATCH HYSTERESIS RECEIVER

TECHNICAL FIELD

The present invention generally relates to the field of a receiver circuit.

BACKGROUND ART

Conventionally, a latch hysteresis receiver circuit is typically used for receiving signals from an external source outside of a die, onto the die, and then translating the signal from an external power supply to an internal power supply. A receiver circuit with hysteresis has different switch point voltages depending on whether the input voltage is going from a logical "0" (low) to a logical "1" (high) or vice versa. The delta (or difference) between the switch point voltages is commonly referred to as hysteresis. It is noted that the low switch point voltage is commonly referred to as the switch point low voltage (VSPL) while the high switch point voltage is commonly referred to as the switch point high voltage (VSPH). Through hysteresis, conventional latch hysteresis receivers are also implemented with noise immunity. In this manner, the latch hysteresis receiver circuit is able to operate properly even when it receives noise as part of an input signal.

It is noted that latch hysteresis receiver circuits may be implemented differently in order to provide particular functions. For example, some latch hysteresis receiver circuits are designed to operate as a low current and low voltage device. For example, a latch hysteresis receiver circuit may operate utilizing battery power where it is desirable to keep power consumption to a minimum in order to extend the life of the battery (or batteries). Additionally, these low power latch hysteresis receiver circuits may be designed to receive a wide range of input voltage signals so that they may be utilized within different circuitry.

Figure 1:
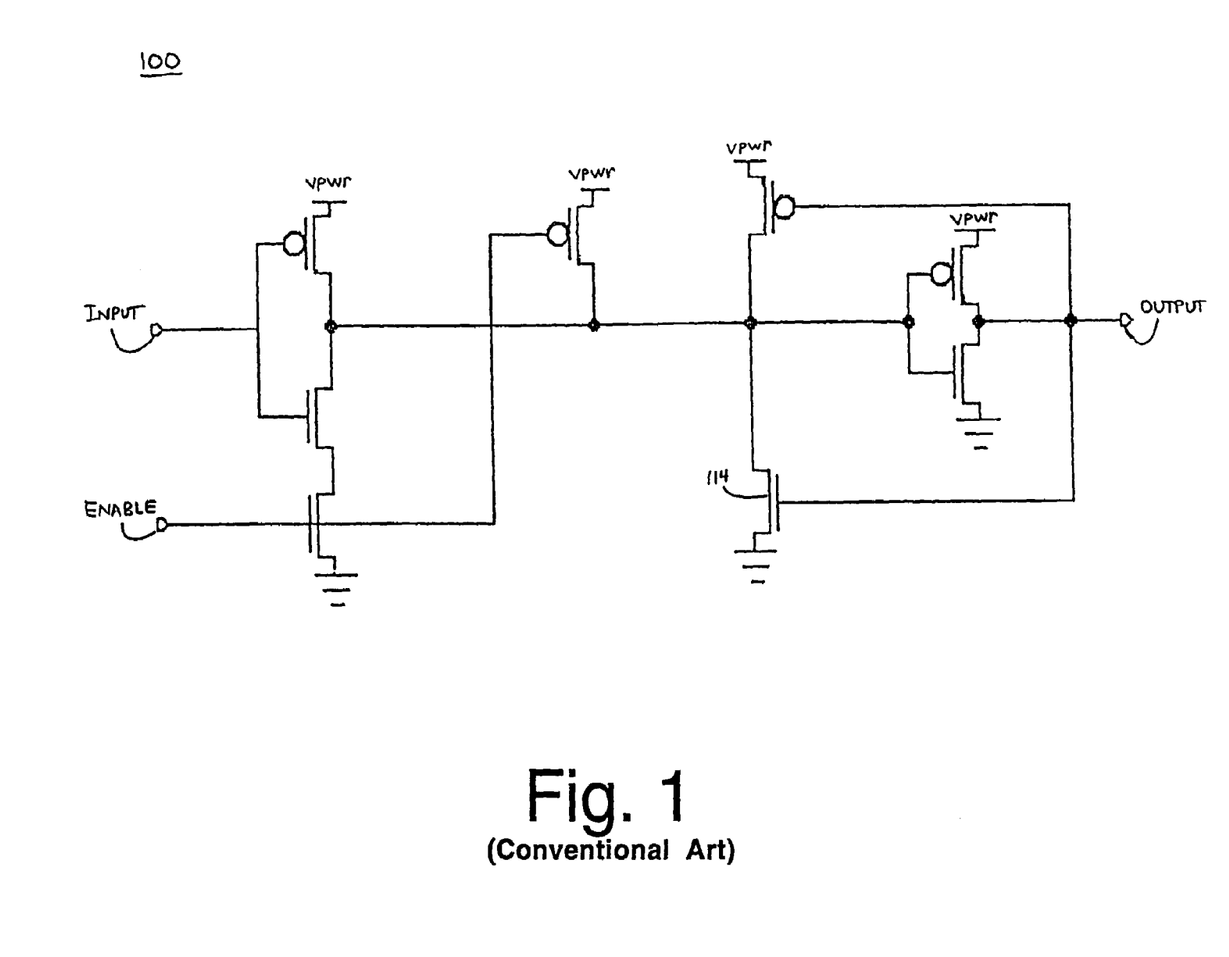
FIG. 1 is a schematic diagram of an example of a conventional latch hysteresis receiver circuit.

FIG. 1 shows a schematic diagram of an example of a conventional latch hysteresis receiver circuit 100 that is designed to receive a wide range of input voltage signals and also operate as a low current and low voltage device. However, there are some disadvantages associated with the conventional latch hysteresis receiver circuit 100. One of the disadvantages is that the latch hysteresis receiver 100 is not able to effectively operate when its switch point low voltage is less than its most positive down level (MPDL) voltage.

One conventional solution is to reduce the current flowing through transistor 114 in order to make it weaker, which can be done by making its length longer decreasing W/L ratio. However, this conventional solution is unable to maintain the switch point low voltage greater than the most positive down level voltage.

Alternatively, another conventional solution is to stack an N-channel MOSFET (metal-oxide semiconductor field-effect transistor) in series with transistor 114 in order to reduce the current flowing through them. However, this conventional solution is also unable to maintain the switch point low voltage above the most positive down level voltage.

SUMMARY OF THE INVENTION

Accordingly, a need exists for a way to enable a latch hysteresis receiver circuit designed to receive a wide range of input voltage signals and operate as a low current and low voltage device to maintain its switch point low voltage (VSPL) above its most positive down level (MPDL) voltage. Embodiments of the present invention satisfy the above mentioned need.

For example, one embodiment of the present invention provides a latch hysteresis receiver circuit having reduced crowbar current. Within the present embodiment, the latch hysteresis receiver circuit comprises an input stage and a latch hysteresis switching element coupled to the input stage. Additionally, the latch hysteresis receiver circuit comprises a pass gate coupled to the latch hysteresis switching element and to an output of the latch hysteresis receiver circuit. It is noted that the pass gate may be for restricting current that flows through the latch hysteresis switching element.

In another embodiment, the present invention includes a method of reducing crowbar current in a latch hysteresis receiver. The method includes utilizing a switching element to lower current that flows through a latch hysteresis switching element of the latch hysteresis receiver. It is understood that the switching element is coupled to the latch hysteresis switching element and an output of the latch hysteresis receiver.

In yet another embodiment, the present invention includes a system for reducing crossover current in a latch hysteresis receiver. The system includes means for restricting current flow through a latch hysteresis switching element of the latch hysteresis receiver. It is appreciated that the means for restricting current flow is coupled to the latch hysteresis switching element and an output of the latch hysteresis receiver.

While particular embodiments of the present invention have been specifically described within this summary, it is noted that the invention is not limited to these embodiments. The invention is intended to cover alternatives, modifications and equivalents which may be included within the spirit and scope of the invention as defined by the claims.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to embodiments of the present invention, examples of which are illustrated in the accompanying drawings. While the present invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be evident to one of ordinary skill in the art that the present invention may be practiced without these specific details. In other instances, well known methods, procedures, components, and circuits have not been described in detail as not to unnecessarily obscure aspects of the present invention.

Exemplary Hardware in Accordance with the Present Invention

Figure 2:
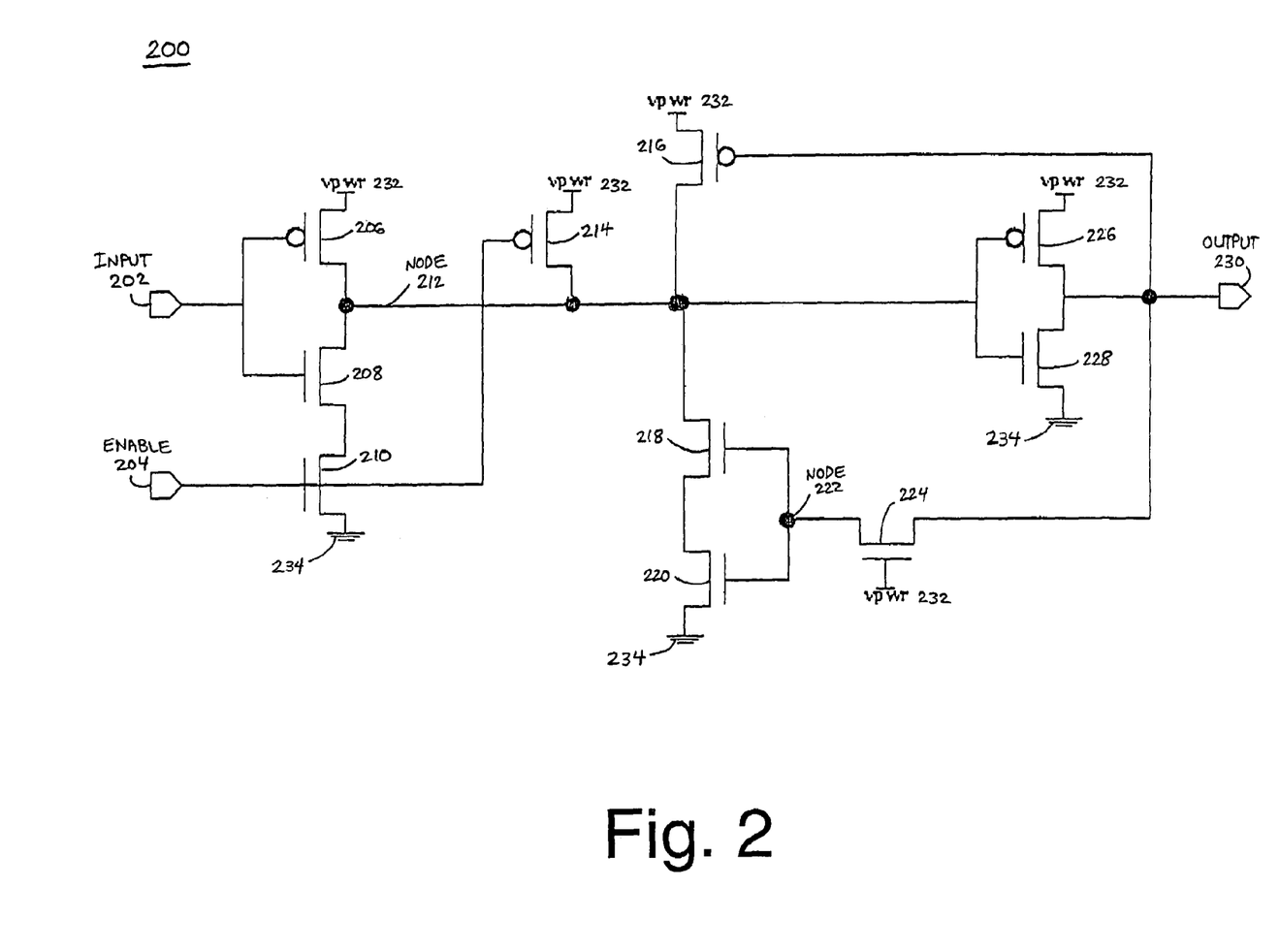
FIG. 2 is a schematic diagram of an exemplary latch hysteresis receiver circuit in accordance with an embodiment of the present invention.

FIG. 2 is a schematic diagram of an exemplary latch hysteresis receiver circuit 200 in accordance with an embodiment of the present invention. It is noted that the latch hysteresis receiver circuit 200 is able to receive a wide variety of input voltage levels and is also able to operate as a low current and low voltage circuit. For example, the latch hysteresis receiver circuit 200 may operate utilizing battery power where it is desirable to keep power consumption to a minimum thereby extending the life of the battery (or batteries). One way of reducing the power consumption of a circuit is by reducing any crowbar (or crossbar) current that may exist within that circuit.

It is appreciated that crowbar current occurs when current of a circuit flows from a power supply right to ground thereby wasting, for example, battery power. The latch hysteresis receiver circuit 200 is implemented to reduce crowbar current while not substantially losing its performance.

For example, one of the ways the crowbar current is reduced within the latch hysteresis receiver circuit 200 is by reducing the current that flows through a transistor 218. As such, a transistor 220 may be coupled in series (or stacked) with the transistor 218 thereby resulting in a reduction of current through it. Additionally, in order to limit the current that flows through the transistor 218 even further, a transistor 224 is coupled to the gates of transistors 218 and 220 and also coupled to output 230. Specifically, the transistor 224 is able to lower the gate to source voltage for transistors 218 and 220 thereby limiting the current flow through those devices. That is, the transistor 224 provides a threshold voltage ($V_t$) drop from the voltage of output 230 such that node 222 is equal to the voltage of output 230 minus the threshold voltage of transistor 224. For example, when there is a high to low voltage transition at input 202 of the latch hysteresis receiver circuit 200, there is a threshold voltage drop across transistor 224 from the voltage of output 230 to node 222. By utilizing transistor 224 having a particular threshold voltage, the gate to source voltage for transistors 218 and 220 may be effectively set to reduce the crowbar current of latch hysteresis receiver circuit 200. As such, the transistor 224 may be referred to as a voltage limiter or pass gate.

Within FIG. 2, it is noted that the latch hysteresis receiver circuit 200 is well suited to be modified in a wide variety of ways in accordance with the present embodiment. For example, as shown in a latch hysteresis receiver circuit 200A of FIG. 2A, one or more transistors (e.g. 225) may be coupled in series with transistor 224 in order to effectively set the gate to source voltage for transistors 218 and 220. In this manner, the threshold voltage drop across transistor 224 is added together with the threshold voltage drop of each transistor (e.g., 225) coupled in series with it. As such, the voltage level at node 222 may be specifically determined and set in order to reduce the current flow through transistors 218 and 220 resulting in a reduction of crowbar current in the latch hysteresis receiver circuit 200. It is understood that transistor 224 along with any additional transistors (e.g. 225) coupled in series with it may be referred to as a voltage limiter or pass gate.

Figure 2A:
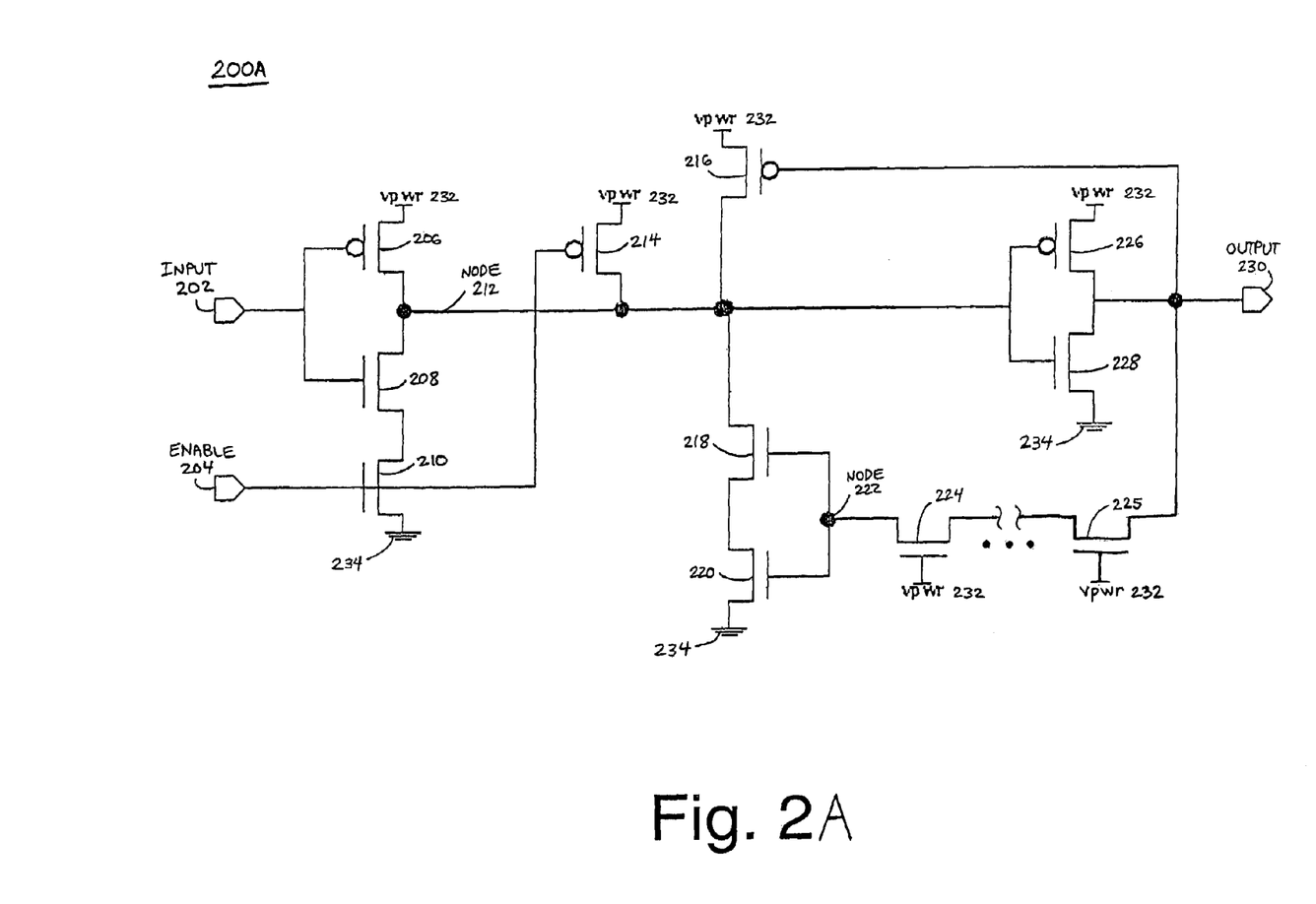
FIG. 2A is a schematic diagram of an exemplary latch hysteresis receiver circuit in accordance with another embodiment of the present invention.

One advantage of the latch hysteresis receiver circuit 200 (or 200A) is that the current flow can be set through transistors 218 and 220 by setting their gate to source voltage with transistor 224 or a combination of one or more transistors (e.g., 225) coupled in series with it. It is understood that transistor 224 and any other transistors (e.g., 225) coupled in series with it may each be implemented with a varying range of threshold voltage levels in order to tailor the overall desired threshold voltage drop from output 230 to node 222.

For example, a threshold voltage for transistor 224 may be 0.5V and the output 230 gets driven to V power (vpwr) which is 2.0V. As such, node 222 would be equal to the voltage of output 230 (e.g., 2.0V) minus the threshold voltage of transistor 224 (e.g., 0.5V) resulting in a value of 1.5V. However, a threshold voltage of transistor 224 may be 0.25V and the output 230 gets driven to V power (vpwr) which is 2.0V. Therefore, node 222 would be equal to the value of 1.75V. Alternatively, if a transistor (e.g., 225 of FIG. 2A) is coupled in series with transistor 224 and each had a threshold voltage of 0.5V, then node 222 would pull up to 1 V resulting in a decrease of current that flows through transistor 218 and 220.

Within FIG. 2, it is noted that another advantage of the latch hysteresis receiver circuit 200 is that it is able to receive at input 202 a wide variety of input voltage levels from an external power supply voltage source such that the switch point low voltage (VSPL) can be set above the most positive down level (MPDL) voltage thereby enable receiver circuit 200 to operate in a proper manner. It is noted that by lowering the current through transistors 218 and 220 (e.g., latch hysteresis switching element of receiver circuit 200), the switch point low voltage can be raised above the most positive down level voltage of the latch hysteresis receiver circuit 200 for a wide range of input voltage levels. It is noted that the switch point low voltage (VSPL) and the most positive down level (MPDL) of latch hysteresis receiver circuit 200 are described in more detail with reference to FIG. 3.

Within latch hysteresis receiver circuit 200, transistors 210 and 214 are used to enable and disable receiver 200 and may be considered part of an input stage of receiver 200. Within the present embodiment, when a logic "1" (high) signal is received by an enable input 204, the latch hysteresis receiver circuit 200 is enabled. However, when a logic "0" (low) signal is received by the enable input 204, the latch hysteresis receiver circuit 200 is disabled. Specifically, when the logic "1" (high) signal is received by enable input 204 it is passed to the gates of transistors 210 and 214. As such, the high signal turns on transistor 210 and turns off transistor 214. In this manner, latch hysteresis receiver circuit 200 is able to operate since the voltage at node 212 may be changed in response to signals received at input 202. However, when a logic "0" (low) signal is received by the enable input 204 and passed to the gates of transistors 210 and 214, it turns off transistor 210 and turns on transistor 214. Consequently, node 212 is held at a logic "1" (high) voltage level of vpwr 232 thereby restricting the voltage level of output 230 from changing. In this manner, the latch hysteresis receiver circuit 200 may be disabled.

Referring to FIG. 2, the latch hysteresis receiver circuit 200 includes transistors 206 and 208 which act as an inverter for a signal received at input 202. For example, when input 202 receives a logic "1" (high) signal, the transistor 208 will be activated and drives node 212 towards ground 234. However, when input 202 receives a logic "0" (low) signal, the transistor 206 will be activated and pulls node 212 up to the voltage level of vpwr 232. It is understood that the transistors 206 and 208 may be considered part of the input stage of receiver 200.

The latch hysteresis receiver circuit 200 also includes transistors 226 and 228 that form an inverter for driving a load coupled to the output 230. It is noted that transistors 226 and 228 may be considered a driver stage of the latch hysteresis receiver 200. Additionally, transistors 226 and 228 operate in a manner similar to the operation of transistors 206 and 208. As shown, node 212 is coupled to the gates of transistors 226 and 228. As such, when node 212 is at a logic "1" (high) voltage level, that voltage level turns on transistor 228 while turning off transistor 226 thereby driving output 230 towards ground 234. Conversely, when node 212 is at a logic "0" (low) voltage level, that voltage level turns off transistor 228 while turning on transistor 226 thereby pulling output 230 up to the voltage level of vpwr 232. Additionally, it is noted that when input 202 receives a voltage transition from a logic "1" (high) to a logic "0" (low), any excess charge at node 222 is pulled to ground 234 through transistor 228.

Within FIG. 2, the latch hysteresis receiver circuit 200 also includes transistors 216, 218, 220, 226 and 228 that operate as a latch that holds node 212 and output 230 steady when there is a change in voltage at input 202. For example, when input 202 is at a logic "0" (low) voltage level, transistor 208 is off and transistor 206 is on. As the voltage level at input 202 transitions from a logical "0" (low) to a logical "1" (high), transistor 208 will be turning on while transistor 206 will be turning off. However, transistor 216 (e.g., pull-up element of receiver 200) is already on and latches node 212 at the voltage level of vpwr 232. As such, transistor 208 struggles to drive node 212 to ground 234 while transistor 216 struggles to keep node 212 at vpwr 232. Transistor 208 eventually overcomes the influence of transistor 216 and drives node 212 to ground 234. It is noted that by having transistor 208 operate against transistor 216, it changes (or offsets) the switch point of latch hysteresis receiver circuit 200 to a different value away from a midpoint value. In this manner, transistor 216 provides hysteresis to the operation of latch hysteresis receiver circuit 200 and is therefore a hysteresis transistor of receiver 200.

Alternatively, when input 202 is at a logical "1" (high) voltage level, transistors 206 and 216 are off while transistors 208, 218 and 220 are on. As the voltage level at input 202 transitions from a logical "1" (high) to a logical "0" (low), transistor 206 will be turning on. However, transistors 218 and 220 (e.g., pull-down element of receiver 200) are already on and latch node 212 is at the voltage level of ground 234. As such, transistor 206 struggles to pull node 212 up to the voltage level of vpwr 232 while transistors 218 and 220 struggle to keep node 212 at ground 234. Transistor 206 eventually overcomes the influence of transistors 218 and 220 and pulls node 212 up to the voltage level of vpwr 232. By having transistor 206 operate against transistors 218 and 220, it changes (or offsets) the switch point of the latch hysteresis receiver circuit 200 to a different value away from a midpoint value. In this manner, transistors 218 and 220 also provide hysteresis to the operation of latch hysteresis receiver circuit 200 and may be referred to as a latch hysteresis switching element of receiver 200. Therefore, the values of the hysteresis of the latch hysteresis receiver circuit 200 may be determined by the ratio of transistor 208 versus transistor 216 along with the ratio of transistor 206 versus transistors 218 and 220.

Within FIG. 2, the latch hysteresis receiver circuit 200 includes transistors 206 and 208 with each have their gate coupled to receive input voltage 202. The source of transistor 206 is coupled to V power (vpwr) 232 while its drain is coupled to node 212 and the drain of transistor 208. Additionally, the source of transistor 208 is coupled to the drain of transistor 210 while the source of transistor 210 is coupled to ground to ground 234. The gate of transistor 210 is coupled to receive enable signal 204. Within the present embodiment, transistor 206 is implemented as a P-channel MOSFET (metal-oxide semiconductor field-effect transistor) also know as a PMOS while transistors 208 and 210 are each implemented as a N-channel MOSFET (NMOS). However, the present embodiment is not limited to such implementation. It is understood that transistors 206, 208 and 210 may be implemented in a wide variety of ways in accordance with the present embodiment.

The latch hysteresis receiver circuit 200 also includes transistor 214 with its gate coupled to the gate of transistor 210 and its source coupled to vpwr 232. Furthermore, the drain of transistor 214 is coupled to node 212. The drain of transistor 218 is coupled to node 212, its gate is coupled to node 222 while its source is coupled to the drain of transistor 220. The gate of transistor 220 is coupled to node 222 while its source is coupled to ground 234. Additionally, the drain of transistor 216 is coupled to node 212, its source is coupled to vpwr 232 and its gate is coupled to output 230. Within the present embodiment, transistors 214 and 216 are each implemented as a PMOS while transistors 218 and 220 are each implemented as a NMOS. However, the present embodiment is not limited to such implementation. It is appreciated that transistors 214, 216, 218 and 220 may be implemented in diverse ways in accordance with the present embodiment.

The latch hysteresis receiver circuit 200 also includes transistor 224 with its source coupled to node 222, its gate is coupled to vpwr 232 and its drain is coupled to output 230 and the drains of transistors 226 and 228. The source of transistor 226 is coupled to vpwr 232 while its gate is coupled to node 212. Additionally, the source of transistor 228 is coupled to ground 234 while its gate is coupled to node 212. It is understood that the drains of transistors 226 and 228 are coupled to output 230. Within the present embodiment, transistor 226 is implemented as a PMOS while transistors 224 and 228 are each implemented as a NMOS. However, the present embodiment is not limited to such implementation. It is noted that transistors 224, 226 and 228 may be implemented in diverse ways in accordance with the present embodiment.

It is noted that transistors 206, 208, 210, 214, 216, 218, 220, 224, 226 and 228 may each be implemented as a field-effect transistor (FET), a N-channel FET (NFET), a P-channel FET (PFET), a NMOS or a PMOS.

It is appreciated that the latch hysteresis receiver circuit 200A of FIG. 2A is coupled in a manner similar to that shown in the latch hysteresis receiver circuit 200 of FIG. 2. However, within latch hysteresis receiver circuit 200A of FIG. 2A, one or more transistors (e.g., 225) may be coupled in series with transistor 224. For example, the source of transistor 224 is coupled to node 222, its gate is coupled to vpwr 232 and its drain is coupled to the source of transistor 225. The gate of transistor 225 is coupled to vpwr 232 and its drain is coupled to output 230, the drains of transistors 226 and 228, and the gate of transistor 216.

Figure 3:
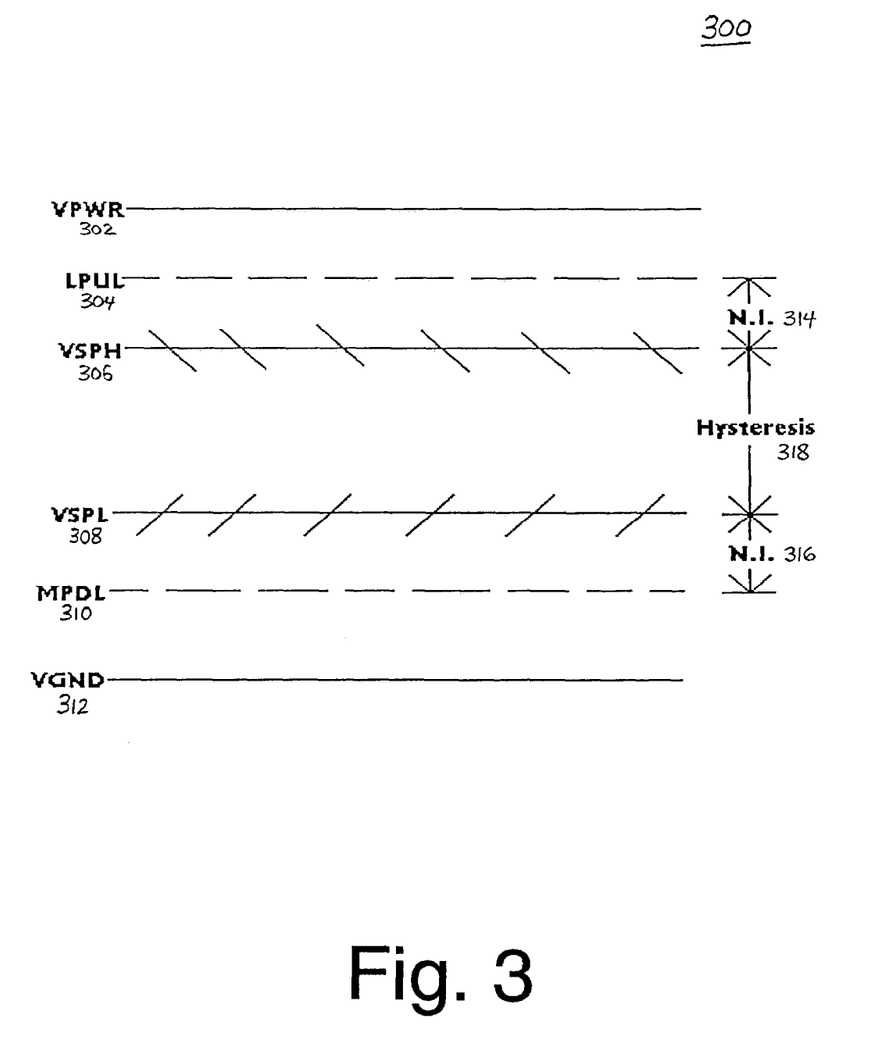
FIG. 3 is an exemplary chart illustrating performance that may be provided by a latch hysteresis receiver in accordance with an embodiment of the present invention.

FIG. 3 is an exemplary chart 300 illustrating performance that may be provided by a latch hysteresis receiver (e.g., 200) in accordance with an embodiment of the present invention. Chart 300 illustrates, among other things, a switch point low voltage (VSPL) 308 along with a switch point high voltage (VSPH) 306. It is understood that in order for the latch hysteresis receiver 200 to operate correctly for input voltage levels that vary over a wide range, the switch point low voltage 308 should be higher than a most positive down level (MPDL) 310 while the switch point high voltage 306 should be lower than a least positive up level (LPUL) 304 as shown by chart 300. The most positive down level 310 is still above a logical ground voltage (VGND) 312 while the least positive up level (LPUL) 304 is still below a voltage power (VPWR) 302 which may be similar to vpwr 232 of FIG. 2. Additionally, it is noted that by properly setting the switch point low voltage 308 along with the switch point high voltage 306 of the latch hysteresis receiver 200, hysteresis 318 is generated between the voltage levels which helps to increase noise immunities 314 and 316. In this manner, the latch hysteresis receiver 200 is able to operate properly without being substantially affected by the reception of false input signals such as noise.

Within the present embodiment, the most positive down level 310 may be based on 20% of the maximum input voltage level received by the latch hysteresis receiver 200 at input 202 while the least positive up level 304 may be based on 80% of the minimum input voltage level received by receiver 200 at input 202. If the input voltage level of the latch hysteresis receiver 200 is VCCQ, the following are exemplary relationships for determining the most positive down level (MPDL) 310 and the least positive up level (LPUL) 304:

$$MPDL = (0.2 * VCCQ_{max}) + 100 \text{ mV}$$

$$LPUL = (0.8 * VCCQ_{min}) - 100 \text{ mV}$$

wherein $VCCQ_{max}$ is the maximum input voltage level received by the latch hysteresis receiver 200 at input 202 while $VCCQ_{min}$ is the minimum input voltage level received by the latch hysteresis receiver 200 at input 202.

Exemplary Operation in Accordance with the Present Invention

Figure 4:
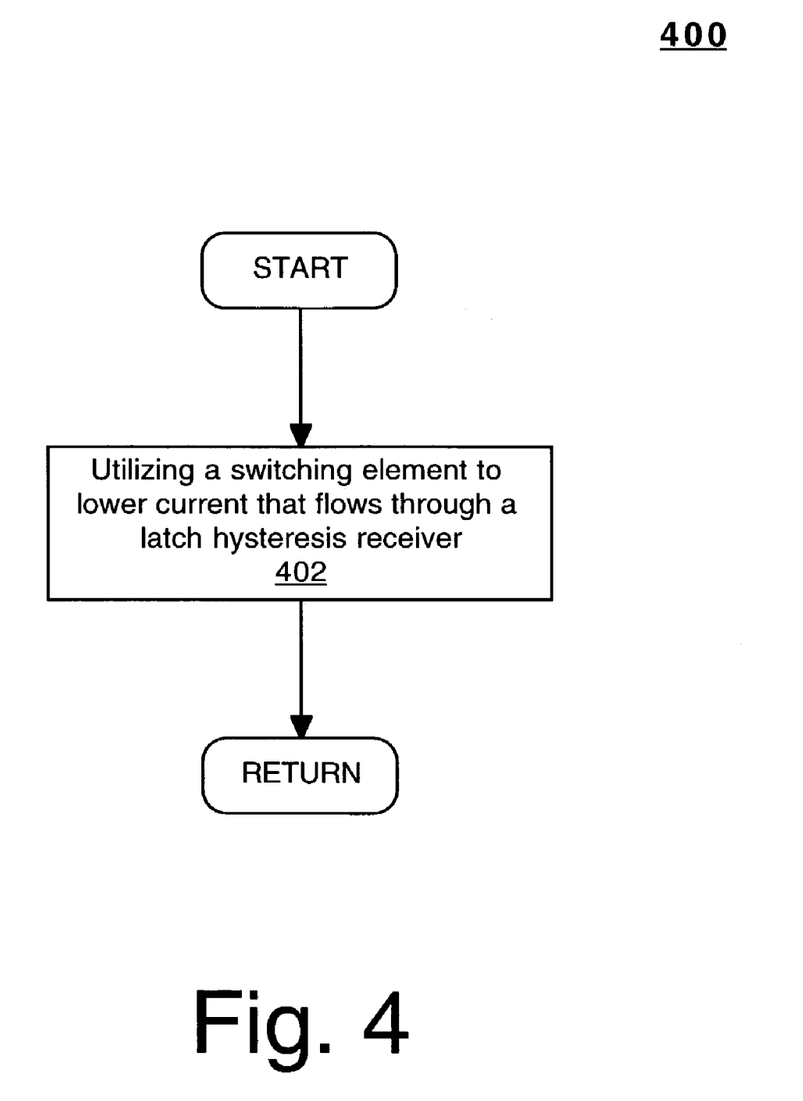
FIG. 4 is a flowchart of steps performed in accordance with an embodiment of the present invention for reducing crowbar (or crossbar) current in a latch hysteresis receiver.

FIG. 4 is a flowchart 400 of steps performed in accordance with an embodiment of the present invention for reducing crowbar (or crossbar) current in a latch hysteresis receiver. Although a specific step is disclosed in flowchart 400, that step is exemplary. That is, the present embodiment is well suited to performing various other steps or variations of the steps recited in FIG. 4.

The present embodiment provides a method for reducing crowbar (or crossbar) current in a latch hysteresis receiver. For example, a switching element is utilized to lower current that flows through a latch hysteresis switching element of the latch hysteresis receiver. It is noted that the switching element may be coupled to the latch hysteresis switching element and also coupled to an output of the latch hysteresis receiver.

At step 402 of FIG. 4, a switching element is utilized to lower, restrict or reduce the current flow through a latch hysteresis switching element of a latch hysteresis receiver. Within the present embodiment, the switching element may be coupled to the latch hysteresis switching element and also coupled to an output of the latch hysteresis receiver. It is noted that the switching element of step 402 may be implemented in a wide variety of ways in accordance with the present embodiment. For example, the switching element may include, but is not limited to, a transistor, a FET, a MOSFET, a NFET, a PFET, a NMOS or PMOS. Additionally, the switching element may include one or more transistors coupled in series between the latch hysteresis switching element and the output of the latch hysteresis receiver. Moreover, the switching element may be implemented as a pass gate of the latch hysteresis receiver.

Furthermore, the latch hysteresis switching element of step 402 may be implemented in diverse ways in accordance with the present embodiment. For example, the latch hysteresis switching element may include one or more of the following, but is not limited to, a transistor, a FET, a MOSFET, a NFET, a PFET, a NMOS or PMOS. Moreover, latch hysteresis switching element may be implemented as a pull down element of the latch hysteresis receiver.

Within FIG. 4, it is noted that the latch hysteresis receiver of step 402 may be implemented in a wide variety of ways in accordance with the present embodiment. For example, the latch hysteresis receiver may include an input stage, the pull down element, a pull-up element, a driver stage and the pass gate which are coupled together. Additionally, it is appreciated that the latch hysteresis receiver, latch hysteresis switching element and the switching element may each be implemented in any manner similar to that described herein. Once step 402 is completed, the present embodiment exits flowchart 400.

Accordingly, embodiments of the present invention enable a latch hysteresis receiver circuit designed to receive a wide range of input voltage signals and operate as a low current and low voltage device to maintain its switch point low voltage (VSPL) above its most positive down level (MPDL) voltage.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A latch hysteresis receiver comprising:
   a latch hysteresis switching element;
   a first transistor; and
   a second transistor directly connected in series with said first transistor, said first and second transistors for reducing crossbar current flow through said latch hysteresis switching element, said first transistor directly connected to said latch hysteresis switching element and said second transistor directly connected to an output of said latch hysteresis receiver and directly connected to a gate of a pull-up element of said latch hysteresis receiver; wherein said pull-up element and gates of said first and second transistors are directly connected to a power supply voltage.

2. The latch hysteresis receiver of claim 1, wherein each of said first and second transistors is a field-effect transistor (FET), a N-channel FET, a P-channel FET, a P-channel MOSFET (metal-oxide semiconductor field-effect transistor), or a N-channel MOSFET.

3. The latch hysteresis receiver of claim 1, wherein said latch hysteresis switching element comprises a transistor.

4. The latch hysteresis receiver of claim 3, wherein said first transistor is directly connected to said transistor of said latch hysteresis switching element.

5. The latch hysteresis receiver of claim 1, wherein said latch hysteresis switching element comprises a first transistor and a second transistor directly connected in series.

6. The latch hysteresis receiver of claim 5, wherein said first transistor of said latch hysteresis receiver is directly connected to a gate of said first transistor of said latch hysteresis switching element and directly connected to a gate of said second transistor of said latch hysteresis switching element.

7. The latch hysteresis receiver of claim 6, wherein said latch hysteresis switching element is a pull-down element of said latch hysteresis receiver, wherein said first transistor of said latch hysteresis switching element is directly connected to said pull-up element of said latch hysteresis receiver, and wherein said second transistor of said latch hysteresis switching element is directly connected to ground.

8. A latch hysteresis receiver circuit comprising:
an input stage;
a latch hysteresis switching element directly connected to said input stage, said latch hysteresis switching element is a pull-down element of said latch hysteresis receiver circuit;
a first transistor; and
a second transistor directly connected in series with said first transistor, said first transistor directly connected to said latch hysteresis switching element and said second transistor directly connected to an output of said latch hysteresis receiver circuit and directly connected to a gate of a pull-up element of said latch hysteresis receiver circuit, said first and second transistors for reducing crowbar current that flows through said latch hysteresis switching element; wherein said pull-up element and gates of said first and second transistors are directly connected to a power supply voltage.

9. The latch hysteresis receiver circuit of claim 8, wherein said first transistor has a first threshold voltage and said second transistor has a second threshold voltage.

10. The latch hysteresis receiver circuit of claim 8, wherein said pull-up element is directly connected to said latch hysteresis switching element and is directly connected to said input stage.

11. The latch hysteresis receiver circuit of claim 10, wherein said latch hysteresis switching element comprises a first transistor and a second transistor directly connected in series.

12. The latch hysteresis receiver circuit of claim 11, wherein said first transistor of said latch hysteresis receiver circuit is directly connected to a gate of said first transistor of said latch hysteresis switching element and is directly connected to a gate of said second transistor of said latch hysteresis switching element.

13. The latch hysteresis receiver circuit of claim 12, wherein said first transistor of said latch hysteresis switching element is directly connected to ground and said second transistor of said latch hysteresis switching element is directly connected to said pull-up element and said input stage.

* * * * *